(12) United States Patent
Nikami

(10) Patent No.: US 6,867,458 B2
(45) Date of Patent: Mar. 15, 2005

(54) SEMICONDUCTOR DEVICE AND METHOD FOR FABRICATING THE SAME

(75) Inventor: Takashi Nikami, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/084,925

(22) Filed: Mar. 1, 2002

(65) Prior Publication Data

US 2003/0047780 A1 Mar. 13, 2003

(30) Foreign Application Priority Data

Sep. 11, 2001 (JP) ........................................ 2001-275538

(51) Int. Cl.[7] .............................................. H01L 27/01
(52) U.S. Cl. ...................... 257/347; 257/344; 257/336; 257/368; 257/369; 257/408; 257/345
(58) Field of Search ................................ 257/279, 340, 257/344, 345, 347, 348, 349, 350, 351, 352, 353, 354, 324, 368, 369, 335, 336, 394, 400, 389, 407; 438/282, 298, 216, 261, 306, 304, 149, 199, 479, 517

(56) References Cited

U.S. PATENT DOCUMENTS

| | | | | |
|---|---|---|---|---|
| 4,745,079 A | * | 5/1988 | Pfiester | 438/306 |
| 5,144,390 A | * | 9/1992 | Matloubian | 257/347 |
| 5,371,391 A | * | 12/1994 | Sato | 257/387 |
| 5,372,960 A | * | 12/1994 | Davies et al. | 438/291 |
| H1435 H | * | 5/1995 | Cherne et al. | 257/347 |
| 5,438,007 A | * | 8/1995 | Vinal et al. | 438/289 |
| 5,466,958 A | * | 11/1995 | Kakumu | 257/345 |
| 5,856,693 A | * | 1/1999 | Onishi | 257/336 |
| 5,977,591 A | * | 11/1999 | Fratin et al. | 257/344 |
| 6,097,070 A | * | 8/2000 | Mandelman et al. | 257/389 |
| 6,387,739 B1 | * | 5/2002 | Smith, III | 438/157 |
| 6,413,829 B1 | * | 7/2002 | Yu | 438/311 |
| 6,555,446 B1 | * | 4/2003 | Unnikrishnan | 438/459 |

FOREIGN PATENT DOCUMENTS

JP 60-98675 * 6/1985 ................... 29/78

* cited by examiner

Primary Examiner—Donghee Kang
Assistant Examiner—Quang Vu
(74) Attorney, Agent, or Firm—Westerman, Hattori, Daniels & Adrian, LLP

(57) ABSTRACT

Provided is a semiconductor device having a source region formed of a semiconductor, a drain region formed of a semiconductor of the same conductive type as that of the source region, a channel region formed of a semiconductor between the source region and the drain region, a gate insulating film provided on the channel region, and a gate electrode provided on the gate insulating film and formed with a P-N junction including a P-type semiconductor region and an N-type semiconductor region. At this time, the P-type semiconductor region and the N-type semiconductor region of the P-N junction of the gate electrode are electrically insulated.

8 Claims, 6 Drawing Sheets

F I G. 4
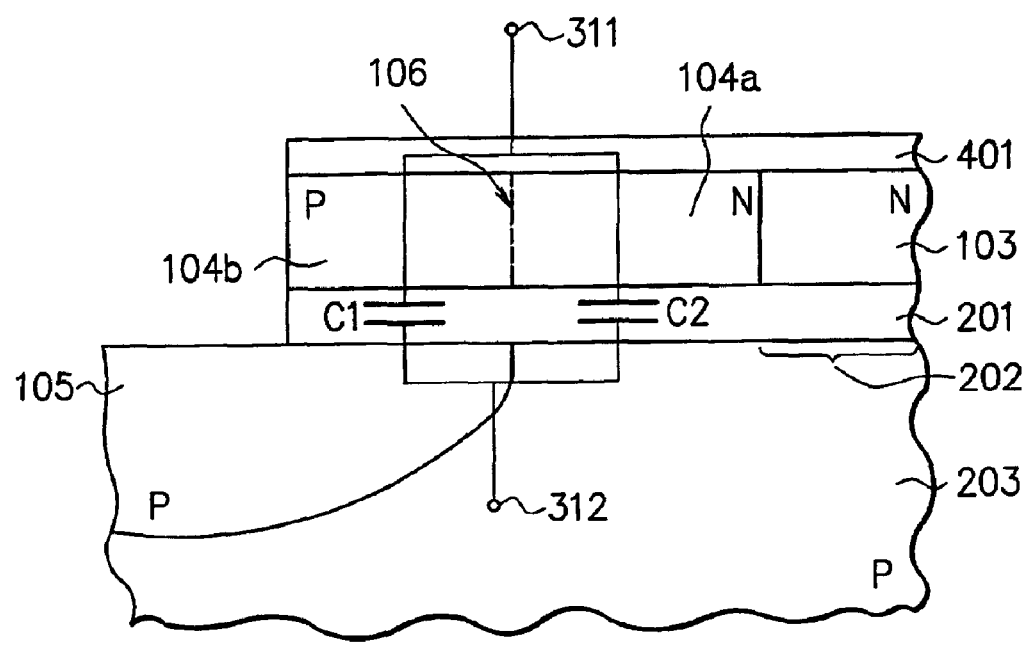

_US 6,867,458 B2_

SEMICONDUCTOR DEVICE AND METHOD FOR FABRICATING THE SAME

CROSS-REFERENCE TO RELATED APPLICATIONS

This application is based upon and claims priority of Japanese Patent Application No. 2001-275538, filed on Sep. 11, 2001, the contents being incorporated herein by reference.

BACKGROUND OF THE INVENTION

1. [Field of the Invention]

The present invention relates to a semiconductor device and a method for fabricating the same, and particularly to a semiconductor device including a MOS (metal oxide semiconductor) transistor and a method for fabricating the same.

2. [Description of the Related Art]

FIG. 6A to FIG. 6C show a method for fabricating a MOS transistor in a prior art.

As shown in FIG. 6A, silicon oxide films 607 having a predetermined pattern are formed on a silicon region 601. A source region 602 and a drain region 603 are formed on a surface of the silicon region 601. A gate oxide film 604 is formed on a channel region between the source region 602 and the drain region 603. On the gate oxide film 604, a gate electrode 605 and sidewalls (silicon oxide) 606 are formed.

Next, as shown in FIG. 6B, a titanium layer 611 is formed on a substrate. Predetermined annealing is then performed so that silicide ($TiSi_2$) is formed at an interface between the source region 602 and the titanium layer 611, an interface between the gate electrode 605 and the titanium layer 611, and an interface between the drain region 603 and the titanium layer 611.

Subsequently, the titanium layer 611 is etched. As shown in FIG. 6C, the titanium layer 611 is removed and silicide 631, 632, and 633 at respective interfaces remain.

The MOS transistor is formed on an SOI (silicon on insulator) substrate so that the operation of the MOS transistor can be speeded up. However, the formation of the silicide on the gate electrode sometimes causes the reduction in operation speed of a the MOS transistor.

SUMMARY OF THE INVENTION

It is an object of the present invention to further speed up the operation of an MOS transistor.

According to one aspect of the present invention, provided is a semiconductor device comprising: a source region formed of a semiconductor; a drain region formed of the same conductive semiconductor as that of the source region; a channel region formed of a semiconductor between the source region and the drain region; a gate insulating film provided on the channel region; and a gate electrode provided on the gate insulating film and formed with a P-N junction including a P-type semiconductor region and an N-type semiconductor region. At this time, the P-type semiconductor region and the N-type semiconductor region of the P-N junction of the gate electrode are electrically insulated.

The P-type semiconductor region and the N-type semiconductor region of the P-N junction of the gate electrode are electrically insulated, thereby reducing capacitance between the gate electrode and the channel region. The MOS transistor includes the source region, the drain region, and the gate electrode. The reduction in the aforesaid capacitance lowers the CR time constant, which enables the speedup of the MOS transistor.

BRIEF DESCRIPTION OF THE DRAWINGS

FIG. 4 is a cross-sectional view of a semiconductor device of related art;

DETAILED DESCRIPTION OF THE PREFERRED EMBODIMENTS

Figure 1:
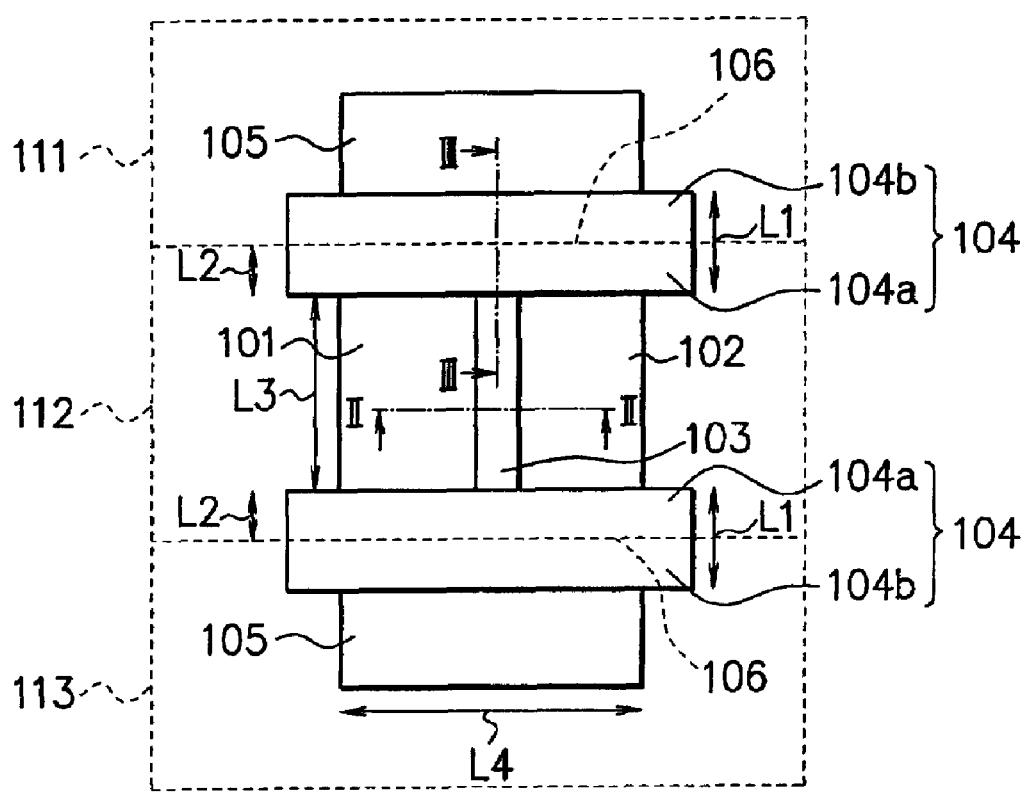
FIG. 1 is a plan view of a semiconductor device according to an embodiment of the present invention.
Figure 2:
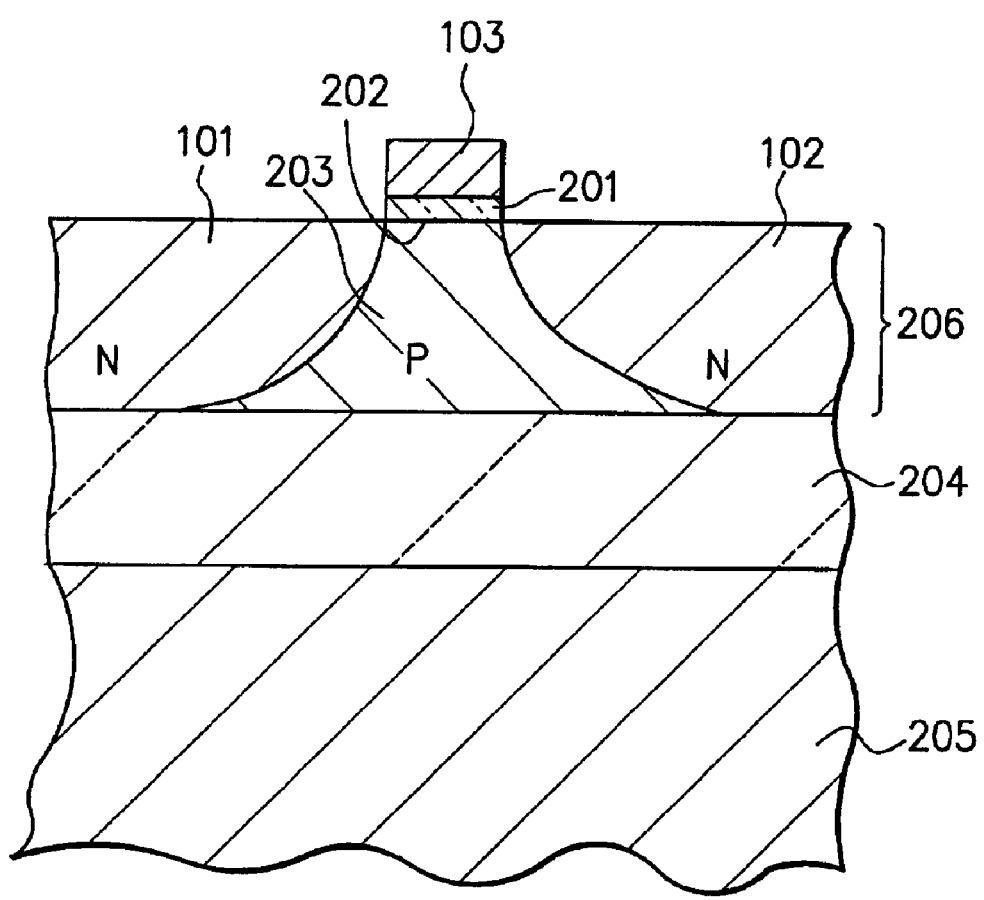
FIG. 2 is a cross-sectional view of the semiconductor device taken along the II—II line in FIG. 1.
Figure 3:
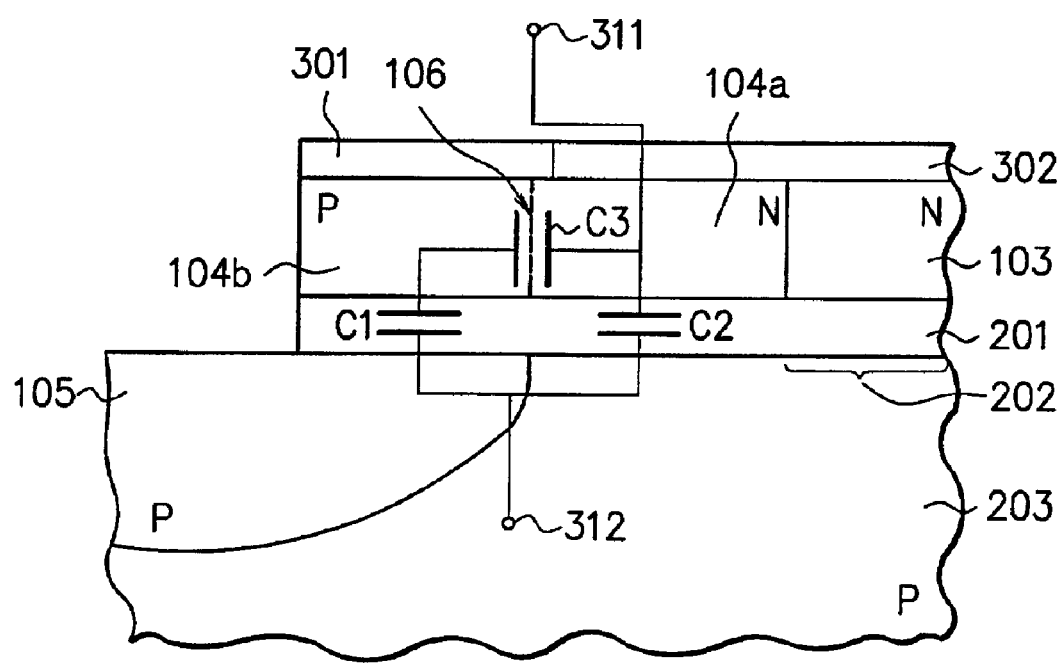
FIG. 3 is a cross-sectional view of the semiconductor device taken along the III—III line in FIG. 1.

FIG. 1 is a plan view of a semiconductor device according to an embodiment of the present invention. A cross-sectional view taken along the II—II line in FIG. 1 is shown in FIG. 2 and a cross-sectional view taken along the III—III line in FIG. 1 is shown in FIG. 3. In this semiconductor device, a MOS transistor is formed on an SOI substrate.

In FIG. 1, a first gate electrode (poly silicon for a gate) 103 is formed between a source region 101 and a drain region 102. Second gate electrodes (poly silicon for separators) 104 are formed at both sides of the first gate electrode 103. The first gate electrode 103 and the second gate electrodes 104 are connected. The first and second gate electrodes 103 and 104 are preferably integrated. Body contact regions 105 are formed outside the second gate electrodes 104 respectively.

An example in which the MOS transistor is an N-channel MOS transistor will be explained. The second gate electrodes 104 each include an N-type semiconductor region 104a and a P-type semiconductor region 104b, and a P-N junction 106 is formed therebetween. A method for fabricating this structure will be explained. A region 111 and a region 113 are masked and N-type impurities are ion-implanted in a region 112 so that the source region 101, the drain region 102, the first gate electrode 103, and the second gate electrodes 104a can be made to be an N-type semiconductor region. Next, the region 112 is masked and P-type impurities are ion-implanted into the region 111 and the region 113 so that the body contact regions 105 and the second gate electrodes 104b can be made to be P-type semiconductor regions.

In FIG. 2, in the SOI substrate, a buried insulating film (a silicon oxide film) 204 is formed on a substrate region 205 made of silicon, and a silicon layer 206 is formed on the buried insulating film 204. In the silicon layer 206, the N-type source region 101, a P-type body region 203, a channel region 202, and the N-type drain region 102 are formed. The channel region 202 is provided on a surface of the silicon layer 206 between the source region 101 and the drain region 102 and formed on the body region 203 in connection therewith. A gate oxide film (a silicon oxide film) 201 is formed on the channel region 202. The gate electrode (poly silicon) 103 is formed on the gate oxide film 201.

In FIG. 3, on a surface of the P-type body region (silicon) 203, the body contact region 105 having a higher P-type impurity concentration is formed. The channel region 202 is, as shown in FIG. 2, provided between the source region 101 and the drain region 102. The first gate electrode (poly silicon) 103 is formed on the channel region 202 with the gate oxide film 201 therebetween. The second gate electrode (poly silicon) 104a and 104b is formed on a part of the body region 203 on which the channel region is not formed, with the gate oxide film 201 therebetween.

The body region 203 is the P-type semiconductor. As explained in FIG. 1, the first gate electrode 103 and the second gate electrodes 104a are made to be the N-type semiconductors by masking the regions 111 and 113 and performing ion-implantation, while the second gate electrodes 104b and the body contact regions 105 are made to be the P-type semiconductors by masking the region 112 and performing ion-implantation. The body contact region 105 has the higher P-type impurity concentration than that of the body region 203. A potential of the body region 203 can be fixed by supplying a prescribed potential to the body contact region 105.

Between the N-type second electrode 104a and the P-type second electrode 104b, the P-N junction 106 is formed. This embodiment is characterized in that a P-type region and an N-type region of the P-N junction 106 of the second gate electrode are electrically insulated by an insulating film 301 which is formed on the second gate electrode.

Figure 6A:
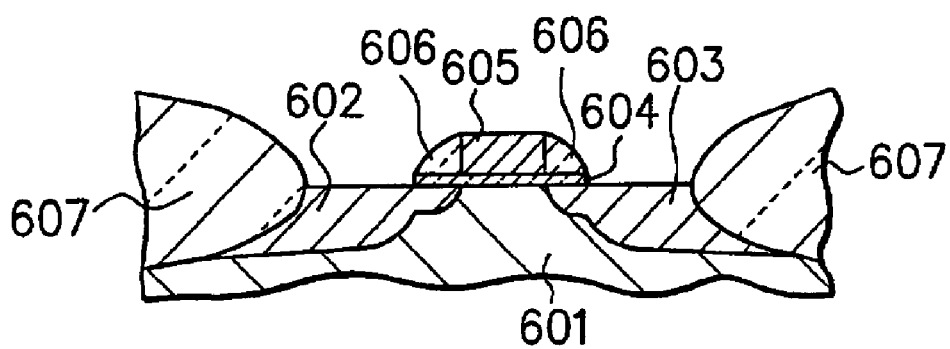
FIG. 6A to FIG. 6C are views showing a method for fabricating a semiconductor device in a prior art.
Figure 6B:
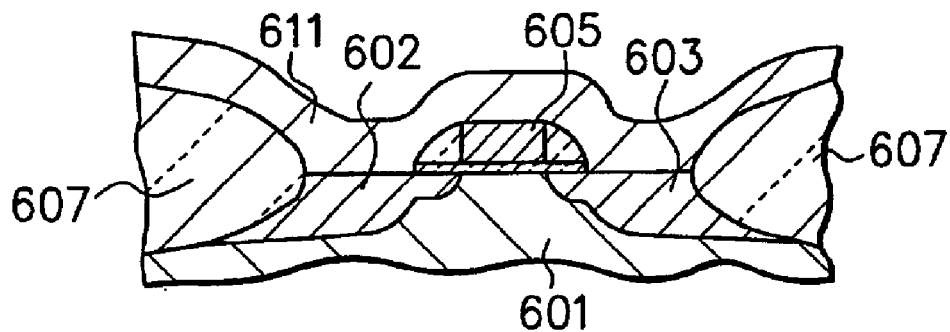
Figure 6C:
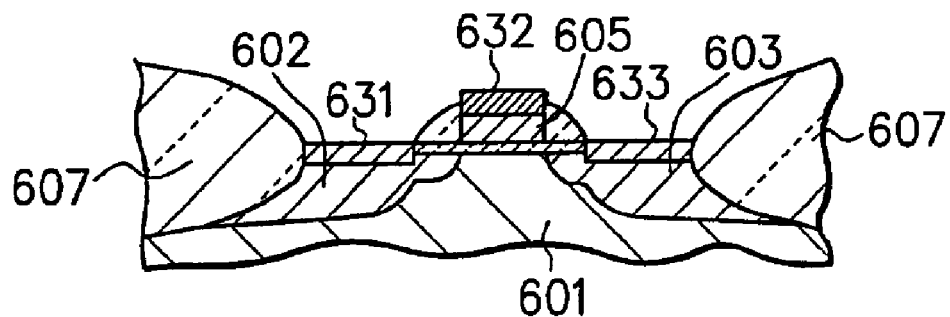

If a MOS transistor is formed by a prior method shown in FIG. 6A to FIG. 6C, silicide 632 is formed on a gate electrode 605 as shown in FIG. 6C. In other words, as shown in FIG. 4, silicide (TiSi$_2$) 401 is formed on the first gate electrode 103 and the second gate electrode 104a and 104b. Consequently, the P-N junction 106 of the second gate electrode is covered with the conductive silicide 401.

A gate terminal 311 is a terminal for supplying a gate voltage to the first gate electrode 103 or the second gate electrode 104a and 104b. A body terminal 312 is a terminal for supplying a body voltage to the eve body region 203 via the body contact region 105. An electrically equivalent circuit between the gate terminal 311 and the body terminal 312 will be explained. Between the gate terminal 311 and the body terminal 312, capacitance C1 and capacitance C2 are connected in parallel. The capacitance C1 is capacitance between the P-type second electrode 104b and the body region 203. The capacitance C2 is capacitance between the N-type second electrode 104a and the body region 203. Capacitance C0 between the gate terminal 311 and the body terminal 312 can be expressed by the following formula 1.

$$C0 = C1 + C2 \tag{1}$$

The smaller the capacitance C0 is, the smaller a CR time constant becomes, which enhances the speed of the MOS transistor. Since the usage of the SOI substrate can originally prevent a parasitic device from being formed, the MOS transistor can speed up. In this embodiment, the capacitance C0 is made to be smaller to reduce parasitic capacitance occurring to the gate electrode so that the speed of the MOS transistor is further improved.

In this embodiment, as shown in FIG. 3, the P-type region and the N-type region of the P-N junction 106 of the second gate electrode are electrically insulated by the insulating film 301 formed on the second gate electrode. A film 302 may be an insulating film or a silicide film (a conductive film). Preferably, the film 302 is the silicide film to reduce connection resistance to gate wiring of the gate electrode. The first gate electrode 103 and the second gate electrode 104a are both N-type and connected with each other, that is, integrated electrically as well as physically.

The gate terminal 311 is the terminal for supplying a gate voltage to the first gate electrode 103 or the second gate electrode 104a. The body terminal 312 is the terminal for supplying a body voltage to the body region 203 via the body contact region 105.

An electrically equivalent circuit between the gate terminal 311 and the body terminal 312 is explained. Between the second gate electrode 104a and the body terminal 203, the capacitance C2 exists. Further, between the N-type second gate electrode 104b and the P-type second gate electrode 104b, capacitance C3 exists. Furthermore, between the second gate electrode 104b and the body region 203, the capacitance C1 exists. Accordingly, between the gate terminal 311 and the body terminal 312, the capacitance C3 and the capacitance C1 are connected in series and the capacitance C2 is connected to the series connection in parallel. The capacitance C0 between the gate terminal 311 and the body terminal 312 can be expressed by the following formula 2.

$$C0 = \{C1 \times C3/(C1+C3)\} + C2 \tag{2}$$

The capacitance C0 in formula 2 and the capacitance C0 in formula 1 will be compared. In formula 2, since the capacitance C1 is larger than 0, C3/(C1+C3) naturally becomes smaller than 1. As a result, the capacitance C0 in Formula 2 becomes smaller than C1+C2. In other words, the capacitance C0 in formula 2 becomes smaller than the capacitance C0 in formula 1.

In the embodiment in FIG. 3, the capacitance C0 can be made smaller than that in the case of FIG. 4. The smaller the capacitance C0 is, the smaller the CR time constant becomes, which enables the speedup of the operation of the MOS transistor.

The extent to which the improvement in speed can be expected in the semiconductor device shown in FIG. 1 to FIG. 3 will be explained. In FIG. 1, for example, the length L1 of the second gate electrode 104 in a vertical direction of the drawing is 0.5 $\mu$m. The length L2 of the second gate electrode 104a in the vertical direction is 0.3 $\mu$m. The length L3 of the gate electrode 103 in the vertical direction is 2 $\mu$m. The length L4 of the body contact region 105 in a horizontal direction is 2 $\mu$m.

In FIG. 2 and FIG. 3, a film thickness of the gate oxide film 201 is defined as d, a total area of the first gate electrode 103 and the second gate electrode 104 is defined as S, an area of a part of the body contact region 105 covered with the gate oxide film 201 is defined as S1, and a dielectric constant of the gate oxide film 201 is defined as $\epsilon$.

When the structure in FIG. 4 is employed, the capacitance C0 between the gate and the body can be expressed by the following formula 3.

$$C0 = \epsilon \times (S-S1)/d + \epsilon \times S1/d \tag{3}$$

Meanwhile, in the embodiment in FIG. 3, when junction capacitance of the P-N junction 106 is defined as Cj, the capacitance C0 between the gate and the body can be expressed by the following formula 4.

$$C0 = \epsilon \times (S-S1)/d + 1/(d/\epsilon \times S1 + Cj) \tag{4}$$

In the structure in FIG. 1, values of the areas S and S1 and so on are obtained and a ratio C0×Vdd/Ids (VDD: power source voltage, Ids: saturation current) is calculated to compare the speed in the structure in FIG. 3 with the speed in the structure in FIG. 4. As a result, it is found that the reduction in speed is suppressed in the structure in FIG. 3 and the effect is larger as the capacitance Cj becomes smaller. If the capacitance Cj is equal to capacitance of the gate oxide film, delayed time is shortened by approximately 25% compared with that in the structure in FIG. 4, while even if the capacitance Cj is approximately 10 times the capacitance of the gate oxide film, the delayed time can be expected to be shortened by approximately 5%.

FIG. 5A to FIG. 5F show an example of a method for fabricating the semiconductor device of the present invention.

Figure 5A:
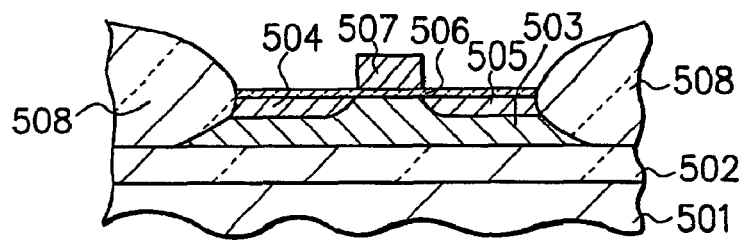
FIG. 5A to FIG. 5F are views showing the method for fabricating the semiconductor device according to the embodiment of the present invention.

An SOI substrate is first prepared. The SOI substrate includes, as shown in FIG. 2, the substrate region 205 made of silicon, the buried insulating film 204, and the silicon layer 206. In FIG. 5A, the silicon layer exists on a substrate region 501 made of silicon and a buried insulating film 502.

As shown in FIG. 5A, silicon oxide films 508 are formed by LOCOS (local oxidation of silicon). Then, a surface of the substrate is etched and oxidized again to form a gate oxide film (a silicon oxide film) 506 on the surface of the substrate. Subsequently, a gate electrode 507 having a predetermined pattern is formed. Next, in order to form an LDD (lightly doped drain), N-type impurities are ion-implanted with the gate electrode 507 as a mask so as to form N-type regions 504 and 505. A body region 503 is a P-type region.

Figure 5B:
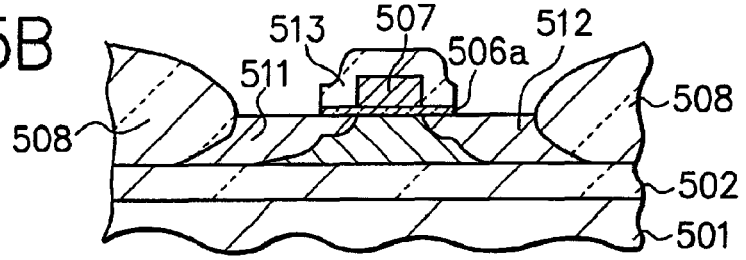

Then, as shown in FIG. 5B, a silicon oxide film is formed on the substrate and etched with a predetermined pattern to leave a silicon oxide film 513 and a gate oxide film 506a. N-type impurities are next ion-implanted with the oxide film 513 and so on as masks to form N-type source region 511 and drain region 512.

Figure 5C:
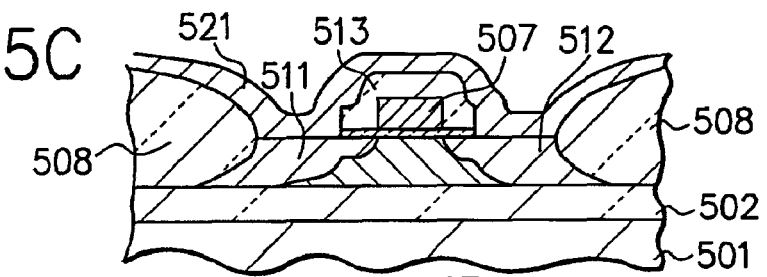

Subsequently, as shown in FIG. 5C, a titanium layer (a metallic layer) 521 is formed on the substrate. Thereafter, predetermined annealing is performed so that silicide (TiSi$_2$) is produced at an interface between the source region 511 and the titanium layer 521 and an interface between the drain region 512 and the titanium layer 521. Since the gate electrode 507 is covered with the silicon oxide film 513, the silicide is not produced on a surface of the gate electrode 507. Incidentally, the material of the metallic layer 521 is not limited to titanium and may be another metal.

Figure 5D:
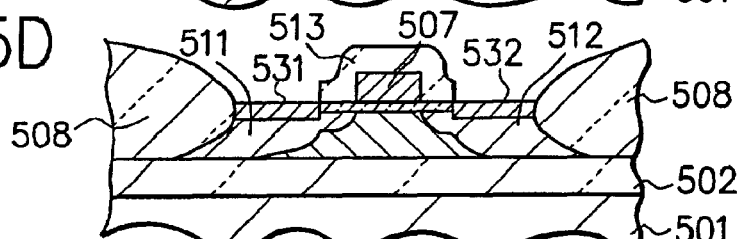

Then, the titanium layer 521 is etched with aqua regia, and the titanium layer 521 is removed as shown in FIG. 5D. Silicide 531 remains on a surface of the source region 511 and silicide 532 remains on a surface of the drain region 512.

Figure 5E:
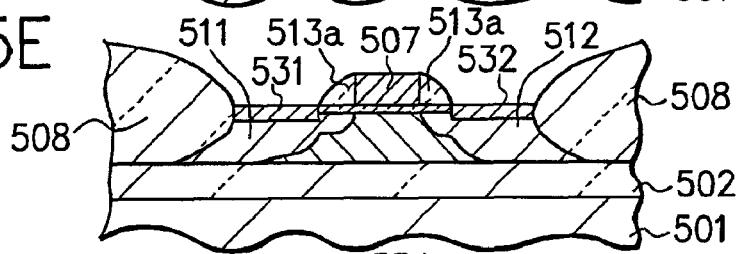

Next, the silicon oxide film 513 is etched so that silicon oxide films 513a remain as sidewalls as shown in FIG. 5E.

Figure 5F:
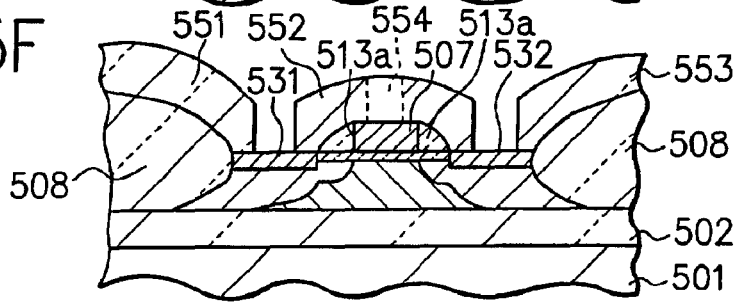

Subsequently, a silicon oxide film is formed on the substrate and etched into a predetermined pattern to form silicon oxide films 551, 552, and 553 as shown in FIG. 5F. Source wiring can be formed at an opening on the silicide 531. Drain wiring can be formed at an opening on the silicide 532. Further, gate wiring can be formed by forming a contact hole 554 in the silicon oxide film 552. Incidentally, the step in FIG. 5E may be omitted.

As explained above, the titanium layer 521 is formed on the substrate while the gate electrode 507 is covered with the silicon oxide film 513 to form the silicide only on the source region 511 and the drain region 512 so that the silicide can be prevented from being produced on the gate electrode 507. Incidentally, it is also suitable that the silicide is prevented from being produced on the gate electrode by other methods or that the silicide is formed on the gate electrode and the produced silicide is removed from the surface of the gate electrode.

Moreover, although no silicide is formed on the gate electrode in the above-described fabricating steps, it is also appropriate that, in FIG. 1, the silicide is formed on the gate electrodes 103 and 104a and the silicide is not formed on the gate electrode 104b by covering it with a silicon oxide film. For example, in the step in FIG. 5B, the silicon oxide film on the gate electrodes 103 and 104a may be removed simultaneously when the silicon oxide film is etched. Alternatively, a step in which the silicon oxide film on the gate electrodes 103 and 104a is removed may be additionally provided before the step in FIG. 5C.

Furthermore, it is also suitable that the silicide is uniformly formed on the gate electrodes and only the silicide on the gate electrode 104b of the formed silicide is removed from the surface of the gate electrode.

The silicide layer is formed on the aforesaid source/drain in order to obtain an advantage that resistance of a surface of the source/drain is further lowered to reduce connection resistance to the source/drain wiring so that the operation of the transistor can be speeded up.

According to this embodiment, as shown in FIG. 3, the P-N junction 106 on the surface of the second gate electrode is electrically insulated so as to reduce the capacitance C0 between the gate and the body. The smaller the capacitance C0 is, the smaller the CR time constant becomes, and the speed of the MOS transistor can be enhanced.

Incidentally, the MOS transistor is not limited to the N-channel MOS transistor and may be a P-channel MOS transistor.

It should be noted that the above-described embodiment is just a concrete example for carrying out the present invention, and therefore the technical range of the present invention is not intended to be interpreted in a narrow sense by it. In other words, the present invention can be realized in various forms without departing from its technical idea or its primary characteristics.

As described above, the P-type semiconductor region and the N-type semiconductor region of the P-N junction of the gate electrode are electrically insulated so that the capacitance between the gate a electrode and the channel region becomes smaller. The MOS transistor includes the source region, the drain region, and the gate electrode. By making the above capacitance smaller, the CR time constant becomes smaller, and the speed of the MOS transistor can be enhanced.

What is claimed is:

1. A semiconductor device, comprising:
   a source region formed of a semiconductor;
   a drain region formed of a semiconductor of the same conductive type as that of said source region;
   a channel region formed of a semiconductor between said source region and said drain region;
   a gate insulating film provided on said channel region; and
   a gate electrode provided on said gate insulating film and formed with a P-N junction including a P-type semiconductor region and an N-type semiconductor region, said P-N junction extending parallel to a source-drain direction of said source region and said drain region,
   wherein said P-type semiconductor region and said N-type semiconductor region of said P-N junction of said gate electrode are electrically insulated on all sides of said P-N junction,
   wherein said gate electrode includes a first gate portion provided above said channel region and a second gate portion provided in the semiconductor device overlying outside of a region which consists of said channel region, said source region and said drain region, and said second gate portion includes said P-N junction.

2. The semiconductor device according to claim 1, wherein silicide is not formed on said P-N junction of said gate electrode.

3. The semiconductor device according to claim 1, wherein said P-N junction of said gate electrode is covered with an insulating material.

4. The semiconductor device according to claim 3, wherein silicide is formed on a part of said gate electrode which is not covered with said insulating material.

5. The semiconductor device according to claim 1, further comprising;
   a body region formed of a semiconductor under said channel region;
   a buried insulating film provided under said body region, said source region, and said drain region; and
   a semiconductor substrate region provided under said buried insulating film.

6. The semiconductor device according to claim 5, further comprising;
   a body contact region formed within said body region and having a higher impurity concentration than said body region.

7. The semiconductor device according to claim 6, wherein said body contact region is formed in a region outside said second gate portion.

8. The semiconductor device according to claim 1, wherein silicide is formed on surfaces of said source region and said drain region.

* * * * *